(12) United States Patent
Rudmann

(10) Patent No.: US 8,582,022 B2
(45) Date of Patent: Nov. 12, 2013

(54) OPTICAL MODULE, WAFER SCALE PACKAGE, AND METHOD FOR MANUFACTURING THOSE

(75) Inventor: Hartmut Rudmann, Jona (CH)

(73) Assignee: Heptagon Micro Optics Pte. Ltd., Singapore (SG)

( * ) Notice: Subject to any disclaimer, the term of this patent is extended or adjusted under 35 U.S.C. 154(b) by 527 days.

(21) Appl. No.: 12/809,395

(22) PCT Filed: Dec. 16, 2008

(86) PCT No.: PCT/CH2008/000533
§ 371 (c)(1),
(2), (4) Date: Oct. 22, 2010

(87) PCT Pub. No.: WO2009/076789
PCT Pub. Date: Jun. 25, 2009

(65) Prior Publication Data
US 2011/0050979 A1 Mar. 3, 2011

Related U.S. Application Data

(60) Provisional application No. 61/014,809, filed on Dec. 19, 2007.

(51) Int. Cl.
*H04N 5/225* (2006.01)
(52) U.S. Cl.
USPC .......................................................... 348/373
(58) Field of Classification Search
USPC .......................................... 348/373, 374, 335
See application file for complete search history.

(56) References Cited

U.S. PATENT DOCUMENTS

| 4,057,837 | A | * | 11/1977 | Needs et al. | 348/373 |
| 5,400,072 | A | * | 3/1995 | Izumi et al. | 348/335 |
| 5,617,131 | A | | 4/1997 | Murano et al. | |
| 5,673,083 | A | * | 9/1997 | Izumi et al. | 348/340 |
| 6,381,072 | B1 | | 4/2002 | Burger | |
| 6,627,814 | B1 | | 9/2003 | Stark | |
| 6,900,843 | B1 | * | 5/2005 | Uchiyama | 348/374 |
| 7,863,702 | B2 | * | 1/2011 | Seo et al. | 257/432 |
| 8,274,599 | B2 | * | 9/2012 | Gustavsson et al. | 348/374 |
| 2003/0010431 | A1 | | 1/2003 | Feldman et al. | |
| 2004/0023469 | A1 | | 2/2004 | Suda | |
| 2006/0181633 | A1 | * | 8/2006 | Seo | 348/340 |
| 2008/0252774 | A1 | * | 10/2008 | Chen et al. | 348/374 |
| 2009/0021635 | A1 | * | 1/2009 | Cheng | 348/374 |

FOREIGN PATENT DOCUMENTS

| EP | 1 837 166 | 9/2007 |
| EP | 1 865 713 | 12/2007 |
| WO | 2005/041561 | 5/2005 |
| WO | 2008/044675 | 4/2008 |
| WO | 2008/132979 | 11/2008 |

* cited by examiner

*Primary Examiner* — James Hannett
(74) *Attorney, Agent, or Firm* — Rankin, Hill & Clark LLP

(57) ABSTRACT

An optical module for an electro-optical device with a functional element, in particular for a camera device, and to an electro-optical device with such a module. The optical module includes a lens substrate portion with at least one lens element, and a spacer. The spacer serves to keep the lens substrate at a well defined axial distance from a base substrate portion of the fully assembled electro-optical device. In order to ensure improved performance of the functional element, an EMC shield is provided. The spacer is at least in parts electrically conductive and thus forms the EMC shield or a part thereof. A method of manufacturing a plurality of such modules on a wafer scale is also provided.

20 Claims, 3 Drawing Sheets

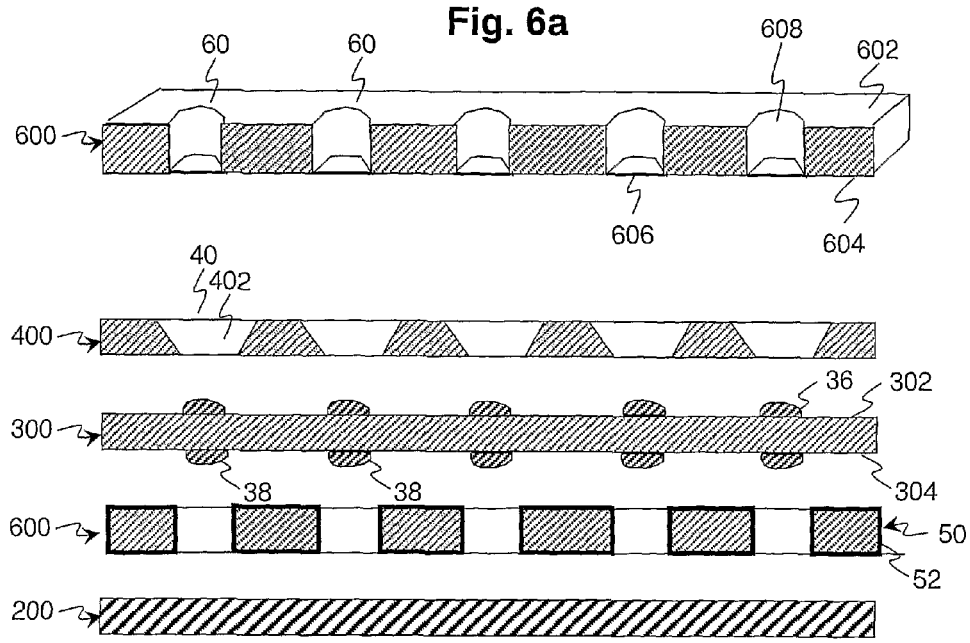
Fig. 6a
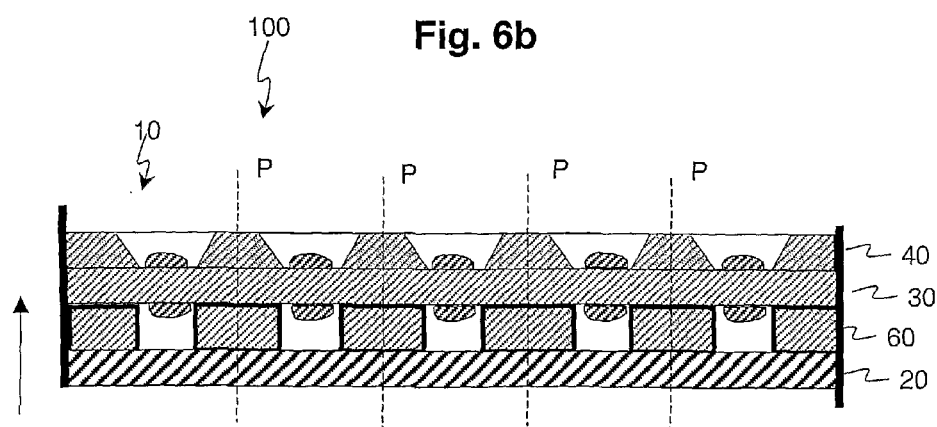
Fig. 6b
Fig. 6c

OPTICAL MODULE, WAFER SCALE PACKAGE, AND METHOD FOR MANUFACTURING THOSE

BACKGROUND OF THE INVENTION

1. Field of the Invention

The invention is in the field of integrated optical modules, in particular integrated camera devices with an image capturing element, such as a CCD or CMOS sensor, and at least one lens element for imaging an object on the image capturing element, e.g. a refractive and/or diffractive lens. Integrated device means that all components are arranged in a well defined spatial relationship. Such integrated camera devices are, for example, cameras of mobile phones which are preferably manufactured in a mass production process at low cost.

More concretely, the invention relates to an optical module for a camera device comprising an EMC shield. The invention further relates to a wafer scale package representing a plurality of such optical modules, and to a method for manufacturing a plurality of optical modules on a wafer scale.

2. Description of Related Art

Especially in the field of mobile phones with cameras, but also for other applications, it is desirable to have a camera device that can be mass produced at low cost in an as simple process as possible and still has a good image quality. Such camera devices comprise an image capturing element and at least one lens element arranged along a common axis, and are known from WO 2004/027880, for example. The known camera devices are manufactured on a wafer scale by replicating a plurality of lens elements on a disk-like substrate (wafer), stacking and connecting the substrates to form a wafer scale package (wafer stack) and dicing the stack in order to separate the individual camera devices from one another.

The camera devices are integrated optical modules, which include functional elements such as the image capturing element and the at least one lens stacked together along the general direction of light propagation. These elements are arranged in a predetermined spatial relationship with respect to one another (integrated device) such that further alignment with each other is not needed, leaving only the integrated device as such to be aligned with other systems.

Wafer-scale replication of lens elements allows the fabrication of several hundreds of generally identical devices with a single step, e.g. a single or double-sided UV-embossing process. Replication techniques include injection molding, roller hot embossing, flat-bed hot embossing, UV embossing. As an example, in the UV embossing process the surface topology of a master structure is replicated into a thin film of a UV-curable replication material such as an UV curable epoxy resin on top of a substrate. The replicated surface topology can be a refractive or a diffractive optically effective structure, or a combination of both. For replicating, a replication tool bearing a plurality of replication sections that are a negative copy of the optical structures to be manufactured is prepared, e.g. from a master. The tool is then used to UV-emboss the epoxy resin. The master can be a lithographically fabricated structure in fused silica or silicon, a laser or e-beam written structure, a diamond turned structure or any other type of structure. The master may also be a submaster produced in a multi stage generation process by replication from a (super) master.

A substrate or wafer in the meaning used in this text is a disc or a rectangular plate or a plate of any other shape of any dimensionally stable, often transparent material. The diameter of a wafer disk is typically between 5 cm and 40 cm, for example between 10 cm and 31 cm. Often it is cylindrical with a diameter of either 2, 4, 6, 8 or 12 inches, one inch being about 2.54 cm. The wafer thickness is for example between 0.2 mm and 10 mm, typically between 0.4 mm and 6 mm.

If light needs to travel through the substrate, the substrate is at least partially transparent. Otherwise, the substrate can be nontransparent as well. In case of a camera device, at least one substrate bears electro-optical functional components, like the image capturing element, and may thus be a silicon or GaAs or other semiconductor based wafer; it may also be a CMOS wafer or a wafer carrying CCD arrays or an array of Position Sensitive Detectors.

Integrated optical modules can be manufactured by stacking wafers along the axis corresponding to the direction of the smallest wafer dimension (axial direction). The wafers comprise lens elements or functional elements, like image capturing elements, in a well defined spatial arrangement on the wafer. By choosing this spatial arrangement in an adequate way, a wafer stack comprising a plurality of generally identical integrated optical modules can be formed, wherein the elements of the optical module have a well defined spatial relationship with respect to one another.

By spacer means, e.g. a plurality of separated spacers or an interconnected spacer matrix as disclosed in US 2003/0010431 or WO 2004/027880, the wafers can be spaced from one another, and lens elements can also be arranged between the wafers on a wafer surface facing another wafer.

It is known to place a baffle in front of the top lens element of a camera device. A baffle is an element that defines a three-dimensional passage for light, but is otherwise intransparent for light. In a camera device, a baffle serves to define a field of view (FOV) of the image capturing element and to suppress beam paths coming from points outside this FOV. Known baffles comprise a front wall of non-transparent material having a given thickness in an axial direction and a through-hole for light transmission with normally varying cross sectional areas, and have side walls projecting from the front wall which normally surround the complete device in the manner of a housing. In known baffles, the through-hole has the shape of a truncated cone with a given extent in the axial direction and given opening angle. The thickness as well as the angle of the side walls of the through hole determines the FOV and the critical angle (collection angle) under which incident light can pass the baffle and enter the camera device.

Electromagnetic compatibility (EMC) refers to the ability of an electrical device to work satisfactorily in its electromagnetic environment without adversely either influencing the surrounding devices, or being influenced by them. Electromagnetic shielding (EMC shielding) limits the flow of electromagnetic fields between two locations, by separating them with a barrier made of conductive material. Typically it is applied to enclosures, separating electrical units from the 'outside world', and to cables, separating wires from the environment the cable runs through. Electromagnetic shielding used to block radio frequency electromagnetic radiation is also known as RF shielding.

The shielding can reduce the coupling of radio waves, electromagnetic fields and electrostatic fields, though not static or low-frequency magnetic fields. The amount of reduction depends very much upon the material used, its thickness, and the frequency of the fields of interest.

Another commonly used shielding method, especially with electronic goods housed in plastic enclosures, is to coat the inside of the enclosure with a metallic ink or similar material. The ink consists of a carrier material loaded with a suitable metal, typically copper or nickel, in the form of very small particles. It is sprayed on to the enclosure and, once dry, produces a continuous conductive layer of metal, which can be electrically connected to the chassis ground of the equipment, thus providing effective shielding. This method, however, is only applicable if there are no sensitive parts within the enclosure, that would be contaminated when applying the conductive material. In particular, it is not suited for devices with optical components, where the optical transmissibility would be adversely affected by the conductive ink.

Small sized integrated camera devices, like those for camera mobile phones, should also be EMC shielded for improved image quality. It is known to put a conductive enclosure around the individual camera device after its complete assembly. This process is thus not compatible with a wafer scale production process. Furthermore, it is complicated to provide and attach the enclosure. On the other hand, also the method of spraying a conductive material on the inner surfaces of the device is not suited, because there are optical elements, like lenses, in the inside of the device that must not be covered with conductive material or otherwise contaminated.

BRIEF SUMMARY OF THE INVENTION

It is thus an object of the invention to provide an optical module for an electro-optical device, like for example a camera device, said module having an EMC shielding that is easy to manufacture, in particular in a mass production process at low costs.

It is a further object of the invention to provide a method for manufacturing a plurality of optical modules having an EMC shielding on wafer scale.

The optical module comprises at least one generally transparent lens substrate portion with at least one lens element, at least one spacer, and an electrically conductive shield which is integral part of the module.

In particular, the optical module comprises at least one lens substrate portion having a front surface and a rear surface, and at least one lens element attached to the at least one lens substrate portion, e.g. to the front surface and/or the rear surface. The optical module further comprises at least one spacer attached to said lens substrate portion. The spacer has a rear surface running generally in parallel to the rear surface of the lens substrate portion at a predetermined distance therefrom. The spacer also comprises an inner side surface extending between the rear surface of the lens substrate and the rear surface of the spacer. The spacer also comprises an outer side surface running generally in parallel to the inner side surface.

The optical module according to the invention is intended to be a part of an electro-optical device, wherein the electro-optical device comprises a functional element arranged on a base substrate portion. The electro-optical device may, for example, be a camera device having an image capturing element, e.g. a CMOS or CCD sensor. The optical module is intended to be placed on top of the base substrate portion, with the spacer keeping the lens substrate portion at a predetermined axial distance from the base substrate portion such that the functional element and/or the lens can be arranged in a cavity between these two substrate portions. In particular, the rear surface of the spacer faces the base substrate portion in the completed electro-optical device. It is, for example, directly attached to the base substrate portion or indirectly via an intermediate layer. The cavity mentioned above is thus defined by parts of the lens and base substrate portion and the inner side walls of the spacer.

The spacer can be part of a conventional baffle, e.g. can be constituted by the side walls of the baffle described with reference to the prior art. In a preferred embodiment of the invention, the spacer is a part of a generally flat spacer substrate or spacer layer attached to the rear surface of the lens substrate portion.

The invention is based on the finding that, in most cases, enclosing the complete optical module or even of the fully assembled electro-optical device with a separate enclosure constituting an EMC shielding is not necessary. Instead, effective shielding can be achieved by arranging a conductive element in the vicinity of the functional element (in the fully assembled electro-optical device), or in the vicinity of its intended position (in the optical module). The invention thus proposes to arrange an EMC shield as an integral part of the module, preferably in the region of the spacer. If more than one spacer or more than one layer of spacers is present, the shield is arranged at least in the region of the spacer or spacer layer constituting the bottom of the optical module and facing the functional element in the fully assembled electro-optical device.

It is preferred to use a spacer which is at least in parts electrically conductive, in particular by comprising a conductive coating on its inner and/or outer side surfaces or by being conductive itself. Though shielding in the region adjacent to the functional element (spacer region) should be sufficient for most purposes, further conductive parts could be arranged elsewhere to improve the shielding, in particular to form, in combination with the conductive spacer, a dome-like or cage-like electrically conductive shield for the functional element. The shield is preferably connected in a conductive manner to the base substrate portion in the fully assembled device.

The shield can be made of elements that are present anyway, in particular it may be a part of the spacer (coating thereon, or spacer made of a conductive material), and/or of an optically non-transmissive coating on the substrates used for beam shaping purposes.

According to a preferred embodiment of the invention, the spacer has a beneficial double or preferably even triple function. It keeps the lens element at a predetermined axial distance from the functional element; it constitutes the EMC shielding, or a part thereof; optionally it protects the inner space of the device and any elements therein from environmental influences during manufacture and use by forming a closed cavity in combination with the lens and base substrate portion. The conductive material is preferably chosen such that it is optically non-transparent, thus resulting in a spacer which is non-transparent or comprises a non-transparent coating, for example. This allows reduction or blocking of stray light that would otherwise enter the module through its side surfaces (via the transparent substrate portions). Consequently, a separate enclosure just for suppression of unwanted light is not necessary (but still possible).

A further advantage of the present invention is that the spacer can be provided with a conductive material suitable for an EMC shield already during manufacture of the spacer, and preferably before forming a wafer scale package comprising a plurality of such optical modules by stacking a lens substrate and spacers or a spacer substrate. The method of manufacture of the optical modules according to the invention is thus fully compatible with a wafer scale manufacturing process, though other manufacturing methods may also be used.

In the fully assembled electro-optical device, the functional element and/or the lens is/are arranged in between the lens substrate portion and the base substrate portion, as seen in an axial direction. Laterally, the functional element and/or the lens element is/are surrounded by the at least one spacer, wherein a preferably closed cavity which accommodates the lens element and/or the functional element is formed by the combination of the substrate portions and the at least one spacer. The inner side surfaces of the spacer form a lateral wall of this cavity. Also, the outer side surfaces of the at least one spacer generally form part of an outer side wall of the optical module or electro-optical device.

According to one embodiment of the invention, the optical module comprises an EMC shield in the inside of the module or device obtained by a conductive coating applied to at least the inner side surface of the at least one spacer, thus on the lateral walls of the cavity described above. In addition, or as an alternative, a conductive coating is applied to at least the outer side surface of the at least one spacer, thus forming an EMC shielding on the outside of the module or device. A further alternative or additional measure is to use a spacer made of or comprising a conductive material.

The camera device according to the invention comprises an image capturing element arranged on a base substrate portion and an optical module as described above. Said optical module is placed on top of the base substrate portion such that the at least one lens is arranged at a predetermined axial distance from the image capturing element. Preferably, a conductive glue is used to connect the optical module to the base substrate portion. The conductive glue forms a conductive layer which is part of the total EMC shield of the device and preferably contacts the conductive parts of the spacer.

A wafer scale package according to the invention comprises a generally transparent lens substrate with a plurality of lens elements, and at least one spacer layer attached to said lens substrate. The spacer layer comprises a plurality of separated or interconnected spacers. The package further comprises at least one electrically conductive shield which is an integral part of at least one of the spacer layer and the lens substrate.

In a preferred embodiment, the lens substrate has a front surface and a rear surface, a plurality of lens elements attached to the at least one lens substrate, and at least one spacer layer attached to said lens substrate. The spacer layer has a front surface and a rear surface and comprises a plurality of separated or interconnected spacers with inner side surfaces extending between the front surface and the rear surface. This inner side surface of the spacer forms a lateral wall of at least one cavity which accommodates the lens elements and/or the functional elements in the fully assembled electro-optical device. The spacer layer can be a continuous spacer substrate having a plurality of cut-outs or through-holes, or can comprise a plurality of individual spacers. According to the invention, the spacer layer is at least in parts electrically conductive in order to form an EMC shield. In particular, the spacer layer may be conductive itself or may comprise a non-conductive basic body with a conductive coating, in particular on at least the inner side surfaces.

A plurality of optical modules can be manufactured on a wafer scale with a method comprising the following steps:
providing a generally transparent lens substrate having a front surface and a rear surface and a plurality of lens elements;
providing a spacer layer having a front surface and a rear surface and comprising a plurality of separated or interconnected spacers with inner side surfaces extending between the front surface and the rear surface;
providing at least one electrically conductive shield which is an integral part of at least one of the spacer layer and the lens substrate;
stacking and connecting the lens substrate and the spacer layer in such a way that the lens elements and the at least one spacer are arranged in a well defined spatial relationship;
dicing the package formed in the step of stacking and connecting the substrates along predetermined planes to produce individual optical modules.

Preferably, a spacer layer is provided which is at least in parts electrically conductive. Such a conductive spacer layer can be formed by applying a conductive coating to at least the inner side surfaces of the spacers prior to the stacking and dicing steps. The conductive spacers can also be formed by applying a conductive coating at least to outer side surfaces of the individual optical modules after the dicing step. Further, the spacer layer can be completely or partly made of a conductive material.

In a preferred embodiment of the invention, there are further conductive elements that are preferably connected in a conducting way to the conductive spacer in order to form the shield. These further elements have the purpose of further shielding the functional element, preferably to form an as complete conductive enclosure of the functional element as possible (dome-like structure, Farraday cage). For example, these further conductive elements comprise a layer of conductive glue in between the spacer layer and the lens substrate or in between the spacer layer and the base substrate. Furthermore, an aperture used for beam shaping can be made of a conductive material, e.g. a blackened metal layer, and connected to the conductive coating and/or conductive spacer.

The invention suggests to use and/or modify components that are anyway present in an optical module in order to achieve an effective EMC shield without increased mechanical or constructive effort, thus achieving a beneficial double or multiple function of these components: In addition to the normal function of the spacer, the spacer serves as carrier for at least part of the shield (conductive layer on the spacer or conductive spacer itself). An optically non-transparent layer on the lens substrate serves as beam-shaping aperture, and in addition—by using a conductive material—as part of the shield. A glue serves to connect the parts to one another, and in addition—by using a conductive material—as part of the shield. A baffle serves for beam shaping and—by a conductive coating—as part of the shield.

Preferably, a baffle is placed on top of the lens substrate portion. The spacer can be an integral part of the baffle, or be a separate element.

Examples for the EMC shield in a small sized optical module or electro-optical device, which can be used alone or in combination with one another or with other means, will be discussed below with reference to the drawings.

BRIEF DESCRIPTION OF THE DRAWINGS

FIG. 6a-c show steps of an inventive manufacturing method.

DESCRIPTION OF THE PREFERRED EMBODIMENTS

Figure 1:
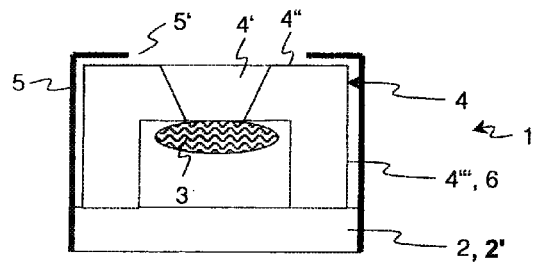
FIG. 1 shows an electro-optical device with an EMC shield according to the prior art.

FIG. 1 shows an electro-optical device 1 with an EMC shield 5 according to the prior art. The device comprises a base substrate portion 2, e.g. a CMOS wafer, with a functional element 2', e.g. an image capturing device such as a camera, CCD, Position sensitive detector, CMOS sensor. A lens element 3 serves for imaging an object onto the functional element 2'. The lens element 3 is attached to an opaque housing 4, which is normally an injection molded one-piece element made of a thermoplastic. The housing 4 is cup-shaped with a planar front wall 4" and lateral walls 4'''. There is a funnel-like through-hole 4' in the front wall 4" which determines the field of view of the functional element 2' and serves to suppress stray light. Such a housing 4 is commonly designated as baffle. The housing 4 with the lens 3 is mounted on top of the base substrate portion 2. Its lateral walls 4''' also serve as a spacer 6 to keep the lens element 3 at a predetermined distance from the base substrate portion 2.

In order to ensure a good image quality, the influence of external electromagnetic radiation on the functional element 2' has to be reduced as much as possible by means of a suitable shielding. For this purpose, a casing 5 consisting of conductive material is provided and mounted such that it encloses the complete unit comprising the base substrate portion 2, and the housing/baffle 4 with the lens 3. The casing 5 extends over the full axial length of the combined base substrate 2 and housing 4 and also covers part of the front surface 4" of the housing/baffle 4. It has an aperture 5' in the region of the through-hole 4', such that light can enter the device 1 via the aperture 5' and the through-hole 4'.

In prior art modules, the casing 5 is an extra part that has to be attached to the module after its completion. The casing has, thus, to have a certain thickness in order to be sufficiently stable to allow automated handling. As there is a demand for very small and lightweight modules, this is considered disadvantageous. A further disadvantage is that the attachment of the casing 5 only after completion of the module is not compatible with mass production on wafer scale.

Figure 2:
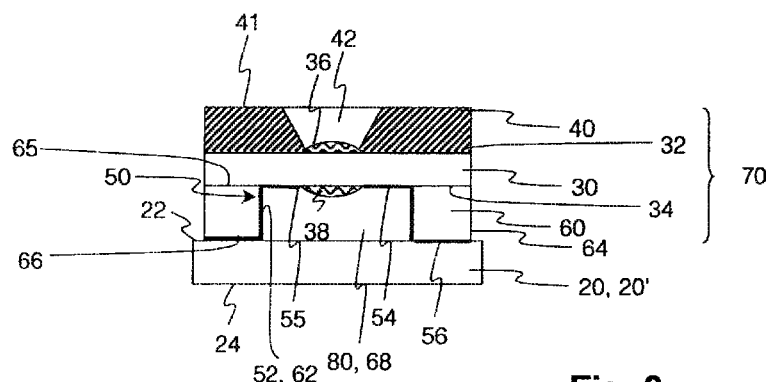
FIG. 2 shows a first embodiment of the invention with a spacer having a conductive coating on its inner side walls.

FIG. 2 illustrates a first embodiment of the invention. In the optical device 10, two lens elements 36, 38 are arranged on a front surface 32 and a rear surface 34, respectively, of a generally transparent lens substrate portion 30. The lens elements 36, 38 have the purpose of imaging an object onto an functional element 20' arranged in a base substrate portion 20, e.g. an image capturing device such as a camera, CCD, Position sensitive detector, CMOS sensor arranged in or on a corresponding substrate. The front surface 32 of the lens substrate portion 30 faces the object to be imaged on the imaging device, the rear surface 34 faces the base substrate portion 20.

A spacer 60 is sandwiched between the lens substrate portion 30 the base substrate portion 20 and keeps the lens substrate portion 30 as well as the lens elements 36, 38 at a predetermined axial distance from the base substrate portion 20 and the sensor therein. The spacer 60 is preferably made in one piece and comprises a generally flat basic body with a planar front surface 65 and a planar rear surface 66 (acting as a reference surface or abutment surface for the base substrate) and a through-hole 68 therein. The walls of the through-hole 68 are also designated as an inner side surface 62 of the spacer 60. The outer side surface 64 of the spacer 60 corresponds to the outer lateral surface of the module.

A preferably closed cavity 80 is formed by the spacer 60 in combination with the lens and base substrate portions 20, 30. The cavity 80 protects the lower lens element 38 as well as the functional element 20' from environmental influences during use and especially manufacture (in particular the dicing step).

A baffle substrate portion 40 is placed on top of the lens substrate portion 30 and attached directly to its front surface 32. The baffle substrate portion 40 has a funnel-like through hole 42 through which light can pass and enter the device. The upper lens 36 is located in the region of the through hole 42. The funnel-like through hole 42 in the baffle substrate portion 40 has the same function as the through-hole 4' in FIG. 1, in particular determination of the field of view of the image capturing element 20'.

According to this embodiment of the present invention, an EMC shield 50 is present. Contrary to the prior art, this shield does not enclose the complete optical device 10, but is arranged in the interior of the device 10, here mainly at the surfaces defining the cavity 80. In the embodiment of FIG. 2, the shield comprises a conductive layer or coating 52 on the inner side surface 62 of the spacer 60.

Preferably, but not necessarily, the shield 50 also comprises a conductive layer or coating 54 on the rear surface 34 of the lens substrate portion 30, said coating 54 having an aperture 55 in the region of the lower lens element 38, and serving for beam shaping. The layers/coatings 52, 54 may be made of the same or different material, e.g. metal or carbon containing layers, like Cr, and are preferably connected to one another in a conductive way.

Optionally, the shield 50 further comprises a conductive layer 56 in between the spacer 60 and the front surface 22 of the base substrate portion 20. The layer 56 is preferably a conductive glue layer, which serves for gluing the spacer 60 to the base substrate portion 20. By the combination of these layers 52, 54, 56, an effective EMC shield 50 constituted by thin layers which are an integral part of the spacer and/or lens substrate is formed.

The shield 50 forms, in the inner part of the device 10, a dome-like structure constituted by thin conductive layers arranged above the base substrate portion 20 and connected thereto in a conductive manner. The shield 50 has an aperture 55 in the region of the lower lens element 38, which is necessary for transmission of light and does not adversely affect the quality of the shielding.

Though, in the present embodiment, conductive layers 54, 56 on the rear surface 34 of the lens substrate portion 30 and on the front surface 22 of the base substrate portion 20 are present, a conductive layer 52 on the side walls of the cavity 80 (side surfaces 62 of the spacer 60) can generally be sufficient. Instead of, or in addition to, a conductive layer 52 on the side walls of the cavity 80 there could also be a conductive layer on the outer side surfaces 64 of the spacer 60, which is optionally connected to the layer 54 on the rear surface of the lens substrate portion 30 in an electrically conductive manner.

The shield 50 also serves for blocking light that would otherwise enter the system via the lateral end faces of the module, or stray light entering through the hole 42 and falling on the inner side surfaces 62, and has, thus, a beneficial double function.

There could also be a further substrate portion with or without further lenses, arranged in between the lens substrate portion and the baffle substrate portion or in between the lens substrate portion and the base substrate portion, preferably separated from the respective substrates by means of spacers, such that two or more cavities are formed. In this case, the conductive layers 52, 54, 56 are arranged in the lowermost cavity, thus in the vicinity of the functional element.

The optical module 70 comprises all layers with the exception of the base substrate 20.

Figure 3:
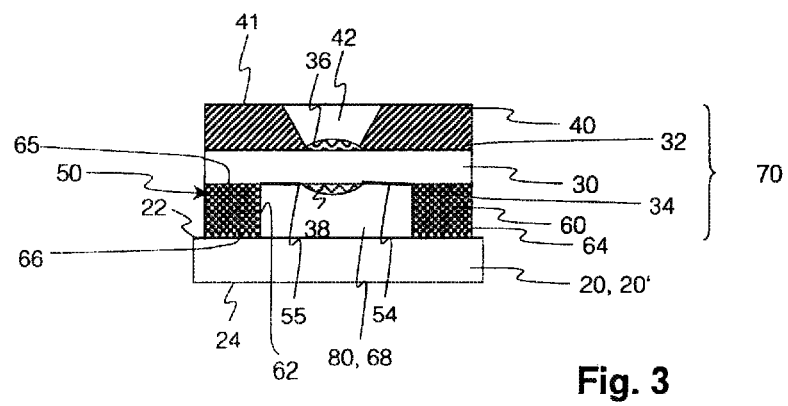
FIG. 3 shows a second embodiment of the invention with a spacer made of or comprising a conductive material.

FIG. 3 shows a further embodiment of the invention. The basic construction—base, lens and baffle substrate portions 20, 30, 40, lens elements 36, 38, and spacer 60—corresponds to FIG. 2. In this case, there is no conductive coating 52 on the side surface of the spacer 60, but the spacer 60 itself is conductive and constitutes part of the EMC shield 50. It is, for example, made of a conductive material or comprises a conductive material. Like in FIG. 2, there is optionally a conductive coating 54 with an aperture 55 on the rear surface 34 of the lens substrate portion 30, which is optionally conductively connected to the spacer 60. There may also be a conductive glue in between the spacer 60 and the base substrate portion 20. This shield has the same effect as the one of FIG. 2.

Figure 4:
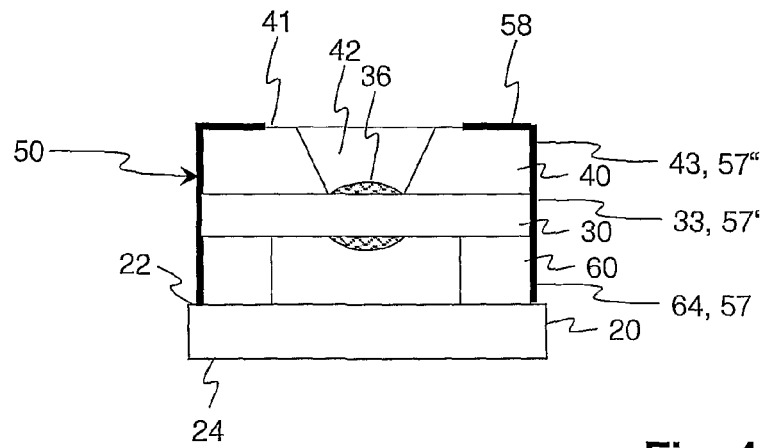
FIG. 4 shows a third embodiment of the invention with a spacer having a conductive coating on its outer side walls.

FIG. 4 shows a further embodiment of the invention, having again the same basic design as in FIGS. 2 and 3. In this embodiment, the outer side surface 64 of the spacer 60 comprises a conductive layer 57, in particular a coating, which constitutes or is part of the EMC shield 50. The layer 57 is connected in a conductive manner to the base substrate portion 20. The side surfaces 33, 43 of the lens substrate portion 30 and the baffle substrate portion 40 may also comprise a conductive layer 57', 57", which may be made in one piece with the layer 57 on the spacer 60, or may be connected thereto in a conductive manner. Optionally, there is also a further conductive layer 58 on the front surface 41 of the baffle substrate portion 40 with an opening in the region of the through-hole 42. There may be further layers present on the front and/or rear surface of the lens substrate, which serve for beam shaping and may constitute a part of the shield.

Figure 5:
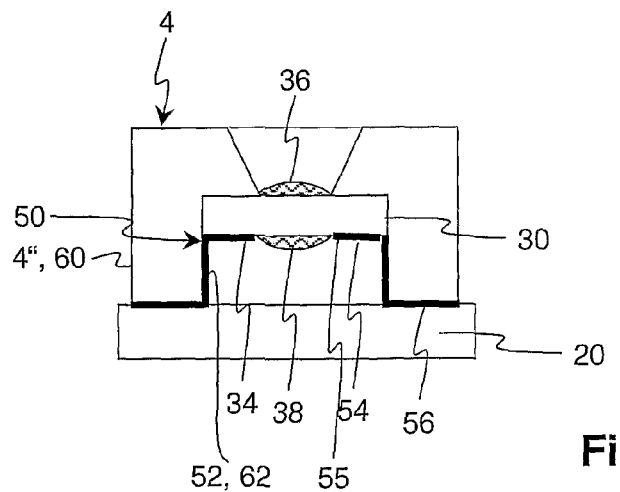
FIG. 5 shows a further embodiment of the invention with a spacer having a conductive coating on its inner side walls.

FIG. 5 shows a further embodiment of the invention with a conventional cup-shaped housing/baffle 4 as shown in FIG. 1. Like in FIG. 2, lens elements 36, 38 are arranged on both surfaces 32, 34 of a lens substrate portion 30. The front surface 32 of the lens substrate portion 30 is attached to the rear surface of the front wall 4" of the baffle 4 such that the lateral walls 4" project beyond the lens substrate portion 30. The baffle 4 is placed on top of the base substrate portion 30, wherein the lateral walls 4"' act as a spacer 60. According to the invention, the inner side walls 62 of the spacer 60 (lateral wall 4" of the baffle 4) comprise a conductive layer 52, as described with reference to FIG. 2. Like in FIG. 2, there is optionally also a conductive layer 54 with an aperture at the rear surface 34 of the lens substrate portion 30 and a conductive layer 56 between the spacer 60 and the base substrate portion 20, preferably a conductive glue.

A method of manufacture is described with reference to FIGS. 6a-c:

FIG. 6a shows a spacer substrate 600 in a partly sectional view. Such a spacer substrate 600 can be used for the embodiments of FIGS. 2-4. The spacer substrate 600 comprises a generally planar front surface 602, a generally planar rear surface 604 and a plurality of through-holes 606 extending between the front and rear surface 602, 604. The through-holes 606 have a cylindrical shape with circular cross section; the cross section could also have another shape, e.g. rectangular. The walls 608 of the through-holes 606 correspond to the inner side surfaces 62 of the individual spacers 60 shown in FIG. 2-4. The spacer substrate 600 normally consists of a transparent material, e.g. glass or a transparent plastic, but could also be non-transparent.

For the embodiment shown in FIG. 3, a spacer substrate 600 is provided which consists of a conductive material or comprises such a material such that the spacer substrate 600 is conductive.

In the other embodiments (FIGS. 2+4), the non-conductive spacer substrate 600 is provided with a layer 52 of conductive material which at least covers the walls 608 of the through-holes 606, and optionally also the front and rear surface 602, 604. The conductive material is preferably applied by a depositing process, such as, CVD, spraying, sputtering, immersing, such that a coating adhering at least to the walls 608 is formed.

The coated spacer substrate 600 is shown in FIG. 6b as second layer from below.

FIG. 6b also shows that further substrates are provided: A baffle substrate 400 comprising a plurality of funnel-like through holes 402; a lens substrate 300 comprising a plurality of lens elements 36, 38 on its front and rear surface 302, 304; and a base substrate 200 with a plurality of functional elements (not shown).

The lens elements 36, 38 are preferably produced by a replication process on both surfaces of the lens substrate 300, which is generally known. The lens elements are pairwise aligned with each other. The lens substrate 300 can on its rear surface optionally be provided with a layer of non-transparent, preferably electrically conductive material having apertures at the intended positions of the lens elements 38, in order to provide the coating 54 and aperture 55 described in connection with FIG. 2. This structure is preferably made by deposition, photolithography and etching, prior to the replication of the lens elements.

In a next step, the substrates 200, 300, 400, 600 are aligned and stacked in an axial direction z. The positions of the through-holes 608 in the spacer substrate 600, of the through-holes 402 in the baffle substrate 400, of the lens elements 36, 38 and of the functional elements are preferably such that these elements are aligned when the substrates are stacked.

FIG. 6c shows a wafer scale package comprising the four substrates 200, 300, 400, 600 shown in FIG. 6b. They are stacked in an axial direction and connected to one another. For connection of the spacer substrate 600 to the lens and base substrate 300, 200, a preferably conductive adhesive is used.

For production of the individual optical devices 10, the package 100 is diced along planes P running in the axial direction.

If the lens elements are suitably covered, the coating can also be done after stacking the lens and spacer substrates 300 and 600 onto one another.

In a modification of the process shown in FIG. 6a-c, in a first intermediate step grooves are formed along planes P, and these grooves are then filled with a conductive material. The package is then diced along the planes P, such that the conductive material constitutes the lateral end faces of the individual modules. This makes it possible to manufacture a device as shown in FIG. 4 on wafer scale. In this case, no coating within the cavities is required.

Though only devices having a base and a lens substrate have been described, there could be one or more additional substrate portion carrying one or more lens elements. Optionally there are additional spacers to space the substrates from one another.

What is claimed is:

1. A method for manufacturing a plurality of optical modules on a wafer scale, each of said optical modules being an optical module for an electro-optical device having a functional element arranged on a base substrate portion, the optical module having at least one generally transparent lens substrate portion with at least one lens element, and at least one spacer, wherein each of the optical modules is intended to be placed on top of the base substrate portion with the at least one spacer keeping the lens substrate portion at a predetermined distance from the base substrate portion, each of the optical modules further having an electrically conductive shield which is an integral part of the respective module, the method comprising the following steps:

Providing a generally transparent lens substrate having a front surface and a rear surface and a plurality of lens elements;

providing a spacer layer having a front surface and a rear surface and comprising a plurality of separated or interconnected spacers with inner side surfaces extending between the front surface and the rear surface;

providing at least one electrically conductive shield which is an integral part of at least one of the spacer layer and the lens substrate;

stacking and connecting the lens substrate and the spacer layer in such a way that the lens elements and at least one spacer are arranged in a well defined spatial relationship;

dicing the package formed in the step of stacking and connecting the substrates along predetermined planes to produce individual ones of said optical modules.

2. Method according to claim 1, wherein the step of providing a spacer layer comprises providing a spacer layer which is at least in parts electrically conductive.

3. Method according to claim 1, wherein the step of providing a spacer layer comprises providing a spacer layer comprising at least one basic body which is made of or comprises a conductive material.

4. Method according to claim 1, wherein the step of providing a spacer layer comprises at least one of: coating at least the inner side surfaces of the spacer layer with a conductive material prior to the stacking and dicing steps, and coating at least the outer side surfaces of the individual optical modules with a conductive material after the dicing step.

5. Method according to claim 4, wherein the coating step comprises depositing a layer of conductive material by means of at least one of spraying, painting, immersing, sputtering, PVD, CVD.

6. Method according to claim 1, further comprising applying a non-transparent conductive coating with a plurality of apertures for the transmission of light to at least one of the front surface and the rear surface of the lens substrate.

7. Method according to claim 1, wherein the step of providing a generally transparent lens substrate comprises forming a plurality of lens elements on the lens substrate by means of a replication process.

8. A method for manufacturing a plurality of electro-optical devices, each of said electro-optical devices including an image capturing element arranged on a base substrate portion and an optical module, the method comprising:

manufacturing a plurality of optical modules by:

providing a generally transparent lens substrate having a front surface and a rear surface and a plurality of lens elements;

providing a spacer layer having a front surface and a rear surface and comprising a plurality of separated or interconnected spacers with inner side surfaces extending between the front surface and the rear surface;

providing at least one electrically conductive shield which is an integral part of at least one of the spacer layer and the lens substrate;

stacking and connecting the lens substrate and the spacer layer in such a way that the lens elements and at least one spacer are arranged in a well defined spatial relationship;

dicing the package formed in the step of stacking and connecting the substrates along predetermined planes to produce individual ones of said optical modules, further comprising providing a base substrate having a plurality of image capturing elements, and stacking and connecting the lens substrate and base substrate in such a way that the image capturing elements and the lens elements are arranged in a well defined spatial relationship, prior to the dicing step.

9. Method according to claim 2, wherein the step of providing a spacer layer comprises providing a spacer layer comprising at least one basic body which is made of or comprises a conductive material.

10. Method according to claim 2, wherein the step of providing a spacer layer comprises at least one of: coating at least the inner side surfaces of the spacer layer with a conductive material prior to the stacking and dicing steps, and coating at least the outer side surfaces of the individual optical modules with a conductive material after the dicing step.

11. Method according to claim 2, further comprising applying a non-transparent conductive coating with a plurality of apertures for the transmission of light to at least one of the front surface and the rear surface of the lens substrate.

12. Method according to claim 3, further comprising applying a non-transparent conductive coating with a plurality of apertures for the transmission of light to at least one of the front surface and the rear surface of the lens substrate.

13. Method according to claim 4, further comprising applying a non-transparent conductive coating with a plurality of apertures for the transmission of light to at least one of the front surface and the rear surface of the lens substrate.

14. Method according to claim 5, further comprising applying a non-transparent conductive coating with a plurality of apertures for the transmission of light to at least one of the front surface and the rear surface of the lens substrate.

15. Method according to claim 2, wherein the step of providing a generally transparent lens substrate comprises forming a plurality of lens elements on the lens substrate by means of a replication process.

16. Method according to claim 3, wherein the step of providing a generally transparent lens substrate comprises forming a plurality of lens elements on the lens substrate by means of a replication process.

17. Method according to claim 4, wherein the step of providing a generally transparent lens substrate comprises forming a plurality of lens elements on the lens substrate by means of a replication process.

18. Method according to claim 5, wherein the step of providing a generally transparent lens substrate comprises forming a plurality of lens elements on the lens substrate by means of a replication process.

19. Method according to claim 6, wherein the step of providing a generally transparent lens substrate comprises forming a plurality of lens elements on the lens substrate by means of a replication process.

20. The method according to claim 1, wherein the functional element is an image capturing element and the electro-optical device is a camera device comprising the image capturing element.

* * * * *